(12) United States Patent
Hook et al.

(10) Patent No.: US 12,040,250 B2
(45) Date of Patent: Jul. 16, 2024

(54) HEAT PIPE FOR VERTICALLY STACKED FIELD EFFECT TRANSISTORS

(71) Applicant: International Business Machines Corporation, Armonk, NY (US)

(72) Inventors: Terence Hook, Jericho Center, VT (US); Brent A. Anderson, Jericho, VT (US); Anthony I. Chou, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 17/841,202

(22) Filed: Jun. 15, 2022

(65) Prior Publication Data

US 2023/0411241 A1 Dec. 21, 2023

(51) Int. Cl.
*H01L 23/427* (2006.01)
*H01L 23/522* (2006.01)
*H01L 27/12* (2006.01)

(52) U.S. Cl.
CPC ........ *H01L 23/427* (2013.01); *H01L 23/5226* (2013.01); *H01L 27/1203* (2013.01)

(58) Field of Classification Search
CPC ............. H01L 23/5226; H01L 27/1203; H01L 23/427; H01L 29/66545; H01L 29/0673; H01L 29/78696
USPC .......................................... 257/213; 438/144
See application file for complete search history.

(56) References Cited

U.S. PATENT DOCUMENTS

| | | | |
|---|---|---|---|
| 7,231,624 B2 | 6/2007 | Vuong et al. | |
| 7,301,107 B2 | 11/2007 | Karthikeyan et al. | |
| 7,888,736 B2 | 2/2011 | Anderson et al. | |
| 9,059,217 B2 | 6/2015 | Cheng et al. | |
| 9,105,467 B2 | 8/2015 | Lee et al. | |
| 9,318,477 B2 | 4/2016 | Lee et al. | |
| 10,153,265 B1 | 12/2018 | Chu et al. | |
| 2021/0384198 A1* | 12/2021 | Chu et al. | ........... H01L 27/1104 |

* cited by examiner

*Primary Examiner* — Thinh T Nguyen
(74) *Attorney, Agent, or Firm* — Scully, Scott, Murphy & Presser, P.C.; Samuel Waldbaum

(57) ABSTRACT

A heat pipe is provided as an electrically inactive structure to dissipate heat that is generated by vertically stacked field effect transistors (FETs). The heat pipe is present in an electrically inactive device area which is located adjacent to an electrically active device area that includes the vertically stacked FETs. The heat pipe includes at least one vertical interconnect structure that continuously extends between each tier of the vertically stacked FETs.

17 Claims, 4 Drawing Sheets

HEAT PIPE FOR VERTICALLY STACKED FIELD EFFECT TRANSISTORS

BACKGROUND

The present application relates to semiconductor technology, and more particularly to a semiconductor structure including a heat pipe present in an electrically inactive device area, the heat pipe is configured to dissipate heat generated by vertically stacked field effect transistors (FETs) that are present in an electrically active device area that is located adjacent to the electrically inactive device area.

Stacking of FETs is an attractive architecture for future complementary metal oxide semiconductor (CMOS) scaling, and potentially for ultimately scaled technology. By directly stacking FETs one over the other (for example, pFETs over nFETs, nFETs over pFETs, pFETs over pFETs, or nFETs over nFETs) significant area scaling can be achieved. In such vertically stacked FETs, thermal issues are recognized as one challenge due to increased power density that is associated with vertically stacked FETs. There is thus a need to provide a stacked FET-containing structure that is capable of mitigating the thermal issues that are present in current vertically stacked FET architecture.

SUMMARY

A heat pipe is provided as an electrically inactive structure to dissipate heat that is generated by vertically stacked FETs. The heat pipe is present in an electrically inactive device area which is located adjacent to an electrically active device area that includes the vertically stacked FETs. The heat pipe includes at least one vertical interconnect structure that continuously extends between each tier of the vertically stacked FETs.

In one aspect of the present application, a semiconductor structure is provided. In one embodiment, the semiconductor structure includes vertically stacked field effect transistors located in an electrically active device area of the semiconductor structure. An electrically inactive structure is located in an electrically inactive device area of the semiconductor structure that is located adjacent to the electrically active device area of the semiconductor structure. The electrically inactive structure includes at least one vertical interconnect structure that continuously extends from an uppermost layer of the vertically stacked field effect transistors to a bottommost layer of the vertically stacked field effect transistors.

In another aspect of the present application, an electrically inactive structure that serves as a heat pipe in a vertically stacked field effect transistor structure is provided. The electrically inactive structure is located in an electrically inactive device area that is located adjacent to an electrically active device area including the vertically stacked field effect transistors. The electrically inactive structure includes at least one vertical interconnect structure that continuously extends from an uppermost layer of the vertically stacked field effect transistors to a bottommost layer of the vertically stacked field effect transistors and is configured to dissipate heat generated by the vertically stacked field effect transistors into a semiconductor substrate that is located beneath the vertically stacked field effect transistors.

DETAILED DESCRIPTION

Figure 1:
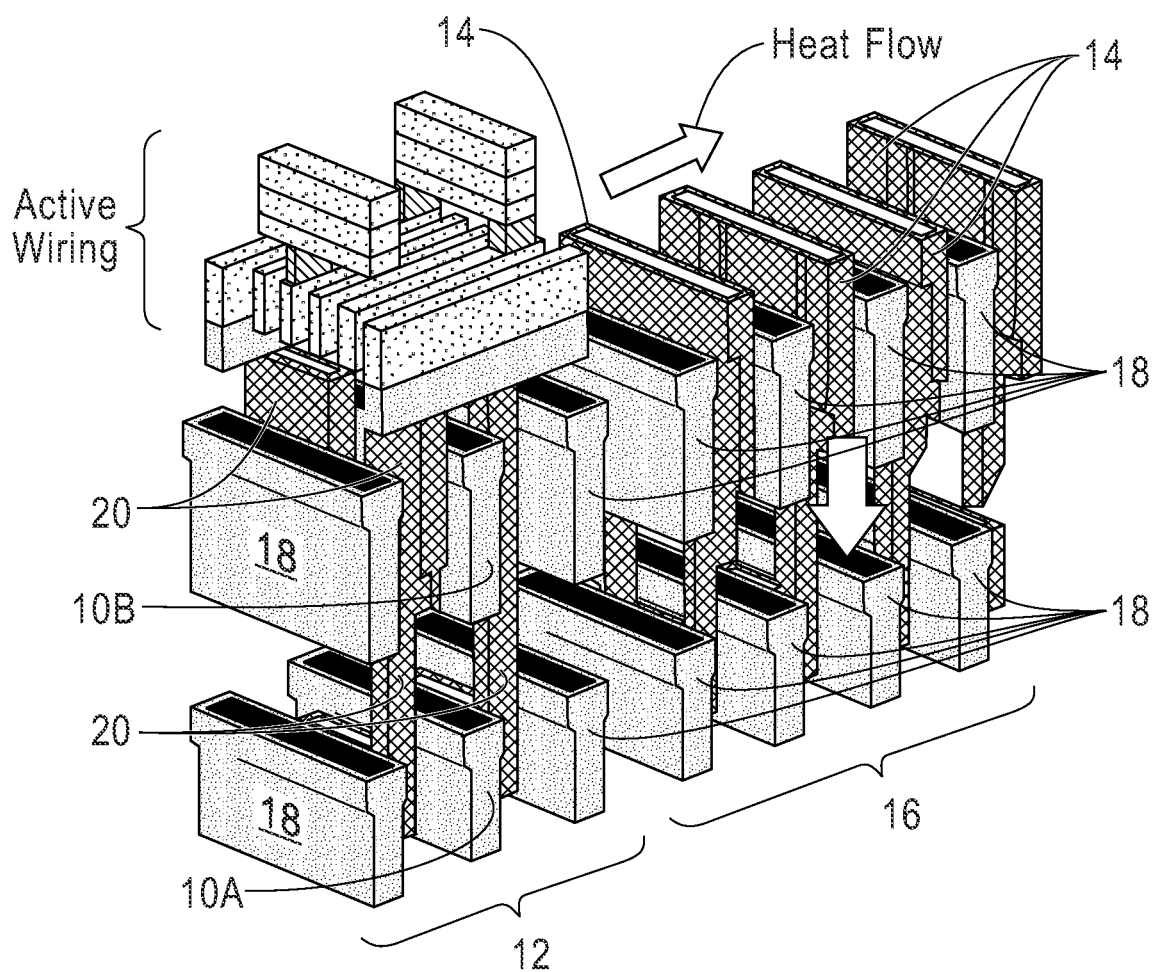
FIG. 1 is a three dimensional (3D) representation of a semiconductor structure in accordance with a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Vertically stacked FETs are considered as a device platform for logic CMOS beyond the 2 nm mode. In vertically stacked FET-containing structures, thermal issues are recognized as one of the challenges associated with such technology. In vertically stacked FET technology, it is understood that the top tier of devices is more thermally isolated from the semiconductor substrate and any backside wiring than the bottom tier of devices, and that the bottom tier of devices is more thermally isolated from the topside wiring than the top tier of devices.

The present application provides a vertically stacked FET-containing structure in which thermal issues caused by the vertically stacked FET architecture is mitigated. Notably, mitigation of thermal issues can be achieved in vertically stacked FET technology by providing an electrically inactive structure (i.e., heat pipe) in a dummy cell area (i.e., an electrically inactive device area) of the structure which is located adjacent to an electrically active device area that includes the vertically stacked FETs. The electrically inactive structure is located between the uppermost layer and the bottommost layer of the vertically stacked FETs. That is, the electrically inactive structure extends continuously from each tier of the vertically stacked FET-containing structure.

Generally, the present application provides a semiconductor structure that includes vertically stacked field effect transistors located in an electrically active device area of the semiconductor structure. An electrically inactive structure is located in an electrically inactive device area of the semiconductor structure that is located adjacent to the electrically active device area of the semiconductor structure. The electrically inactive structure includes at least one vertical interconnect structure that continuously extends from an uppermost layer of the vertically stacked field effect transistors to a bottommost layer of the vertically stacked field effect transistors. Such a semiconductor structure will now be described in greater detail.

The term "vertically stacked field effect transistors (FETs)" is used throughout the present application to denote at least two FETs vertically stacked one atop the other. In some embodiments, three FETs, four FETs, five FETs, etc., can be vertically stacked one atop the other.

The term "field effect transistor, or FET for short" is used throughout the present application to denote a type of transistor that uses an electrical field to control the flow of current in a semiconductor material. FETs are devices with at least three terminals: a source region, a gate electrode, and a drain region. FETs control the flow of current by the application of a voltage to the gate electrode, which in turn alters the conductivity between the drain source and the source region.

The source region and the drain region of the FET are separated by a channel region that lies beneath the gate electrode. A gate dielectric material is present between the channel region and the gate electrode.

The channel region is composed of a semiconductor material that has semiconducting properties (i.e., a semiconductor material). Illustrative examples of semiconductor materials that can be used in providing the channel region include, but are not limited to, silicon (Si), germanium (Ge), a silicon germanium (SiGe) alloy, silicon carbide (SiC), silicon germanium carbide (SiGeC), a III-V compound semiconductor or an II-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In embodiments, the channel region can be contained within a semiconductor material structure such as, for example, a semiconductor nanosheet, a semiconductor fin, or a semiconductor nanowire. In embodiments, the channel region of each vertically stacked field effect transistor is located within a same type of semiconductor material structure, i.e., semiconductor nanosheet, while in other embodiments, the channel region of a lower field effect transistor within the vertically stacked field effect transistors is a first semiconductor material structure (i.e., semiconductor nanosheet or semiconductor fin), while the channel region of an upper field effect transistor that is located immediately above the lower field effect transistor is a second semiconductor material structure (i.e., semiconductor nanosheet or semiconductor fin) that is different from the first semiconductor material structure.

The source region and the drain region are composed of a semiconductor material that contains an n-type dopant or a p-type dopant. The semiconductor material that provides the source region and the drain region includes one of the semiconductor materials mentioned above for the channel region. In some embodiments, the semiconductor material that provides the source region and the drain region can be the same as the semiconductor material that provides the channel region. For example, silicon can be used the semiconductor material for the source region, the drain region and the channel region. In another example, silicon can be used as the semiconductor material for the channel region, while a silicon germanium alloy can be used as the semiconductor material for both the source region and the drain region.

The term "p-type" refers to the addition of impurities to an intrinsic semiconductor material that creates deficiencies of valence electrons. In a silicon-containing semiconductor material, examples of p-type dopants, i.e., impurities, include, but are not limited to, boron, aluminum, gallium and indium. The term "n-type" refers to the addition of impurities that contributes free electrons to an intrinsic semiconductor material. In a silicon containing semiconductor material, examples of n-type dopants, i.e., impurities, include, but are not limited to, antimony, arsenic and phosphorous. The n-type dopant or p-type dopant are typically present in the semiconductor material that provides the source region or drain region in a concentration of from $5\times10^{18}$ atoms/cm$^3$ to $1.5\times10^{21}$ atoms/cm$^3$.

The gate dielectric material can be composed of a dielectric material such as, for example, an oxide, nitride, and/or oxynitride. In one example, the gate dielectric material can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material.

The gate electrode includes a gate conductor material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Portions of the gate electrode may be continuous from the top layer to the bottom layer (as in FIG. 4) or discontinuous (as in FIGS. 1-3).

The term "p-type field effect transistor, or pFET for short" is used throughout the present application to denote a type of FET in which the channel region of the FET is composed of a majority of holes as current carrier. When the FET is activated and is on, the majority of the current flowing are holes moving through the channel region.

The term "p-type field effect transistor, or pFET for short" is used throughout the present application to denote a type of FET in which the channel region of the FET is composed of a majority of electrons as current carrier. When the FET is activated and is on, the majority of the current flowing are electrons moving through the channel region.

In the present application, the term 'electrically active device area" denotes an area that contains electrically active devices such as, for example, vertically stacked FETs. The electrically active device area can contain active logic cells.

In the present application, the term "electrically inactive device area" denotes an area that lies adjacent to the electrically active device area and contains structures that are not electrically active. For example, and in the present application, the electrically inactive device area can include the electrically inactive structure (i.e., at least one vertical interconnect structure) and optionally dummy gate structures. In some embodiments, the electrically inactive device area can be located laterally adjacent to the electrically active device area.

Dummy gate structures are similar to FETs, but lack a source region and/or a drain region. That is, the dummy gate structures include a gate electrode and a gate dielectric, but not a source region and/or a drain region. In some embodiments, the dummy gate structures can be present in both the electrically active device area and the electrically inactive device area. In other embodiments, the dummy gate structure are located only in the electrically inactive device area.

In the present application, the term "vertical interconnect structure" whether present in the electrically active device area or the electrically inactive device area denotes a wiring structure that is composed of an electrically conductive metal or electrically conductive metal alloy. The vertical interconnect structure that is present in the electrically active device area can be referred to herein as an 'active device area vertical interconnect structure'. The vertical interconnect structure present in the electrically inactive device area is an electrically inactive structure that is configured to dissipate heat that is generated by the vertically stacked FETs into a semiconductor substrate that is located beneath the vertically stacked FETs. Thus, the vertical interconnect structure present in the electrically inactive device area functions as a heat pipe in the semiconductor structure of the present application.

Illustrative examples of electrically conductive metals that can be used in the present application to provide the vertical interconnect structures include, but are not limited to, copper (Cu), aluminum (Al), tungsten (W), ruthenium (Ru), or cobalt (Co). Illustrative examples of electrically conductive metal alloys that can be used in the present application to provide the vertical interconnect structures include, but are not limited to, a Cu—Al alloy, a Cu—W alloy, or Ru—Co alloy. In some embodiments of the present application, the active device area vertical interconnect structure can be composed of a compositionally same electrically conductor material (i.e., electrically conductive metal or electrically conductive metal alloy) as the vertical interconnect structure that serves as the electrically inactive structure. In other embodiments of the present application, the active device area vertical interconnect structure can be composed of a compositionally different electrically conductor metal as the vertical interconnect structure that serves as the electrically inactive structure.

The semiconductor substrate is spaced apart from the vertically stacked FETs by a dielectric material. For clarity, the semiconductor substrate and the dielectric material that separates the vertically stacked FETs from the semiconductor substrate are not illustrated in the drawings of the present application. However, one skilled in the art would readily recognize the location of the semiconductor substrate and the dielectric material from the drawings of the present application and the description provided herein.

The semiconductor substrate can be composed of one of the semiconductor materials mentioned above for the channel region. The semiconductor material that provides the semiconductor substrate can be compositionally the same as, or compositionally different from, the semiconductor material that provides the channel region.

The dielectric material that is present between the semiconductor substrate and the vertically stacked FETs can be composed of any dielectric material such as, for example, silicon dioxide or boron nitride.

In some embodiments of the present application, the semiconductor substrate and the dielectric material are components of a semiconductor-on-insulator (SOI) substrate. In such embodiments, the topmost semiconductor material layer of the SOI substrate can be processed into one of the semiconductor material structures mentioned above and serve as a channel region of a bottommost FET of the vertically stacked FETs. In other embodiments, the dielectric material is a deposited dielectric material that is formed after forming at least the bottommost field effect transistor of the vertically stacked field effect transistors.

Figure 2:
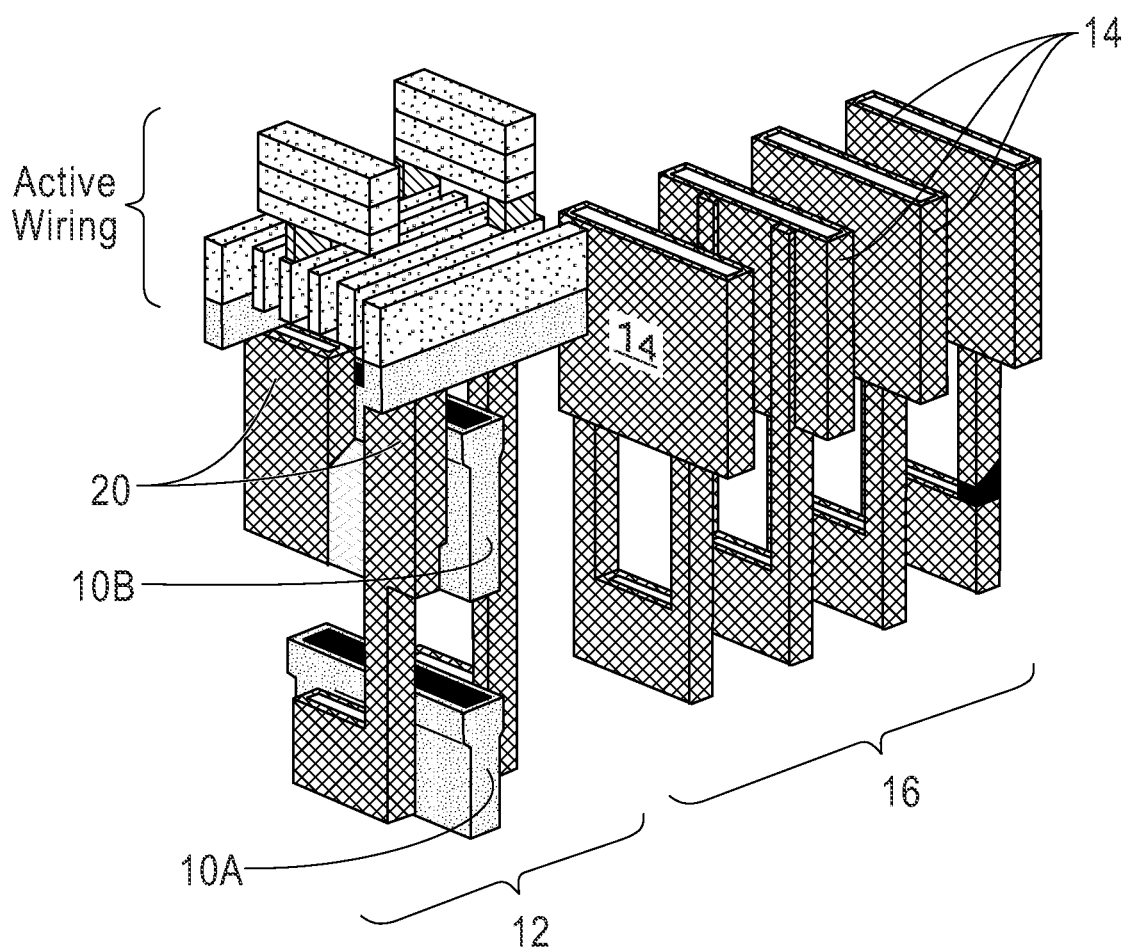
FIG. 2 is a 3D representation of a semiconductor structure in accordance with a second embodiment of the present application.
Figure 3:
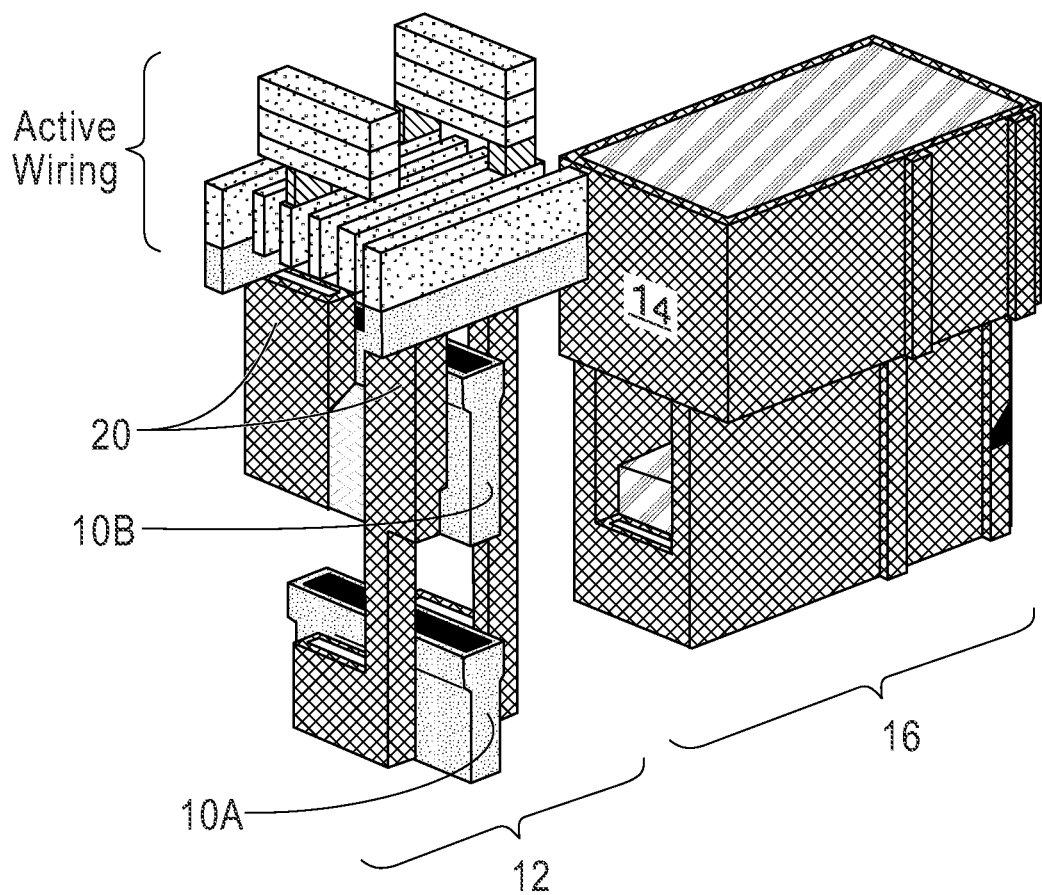
FIG. 3 is a 3D representation of a semiconductor structure in accordance with a third embodiment of the present application.
Figure 4:
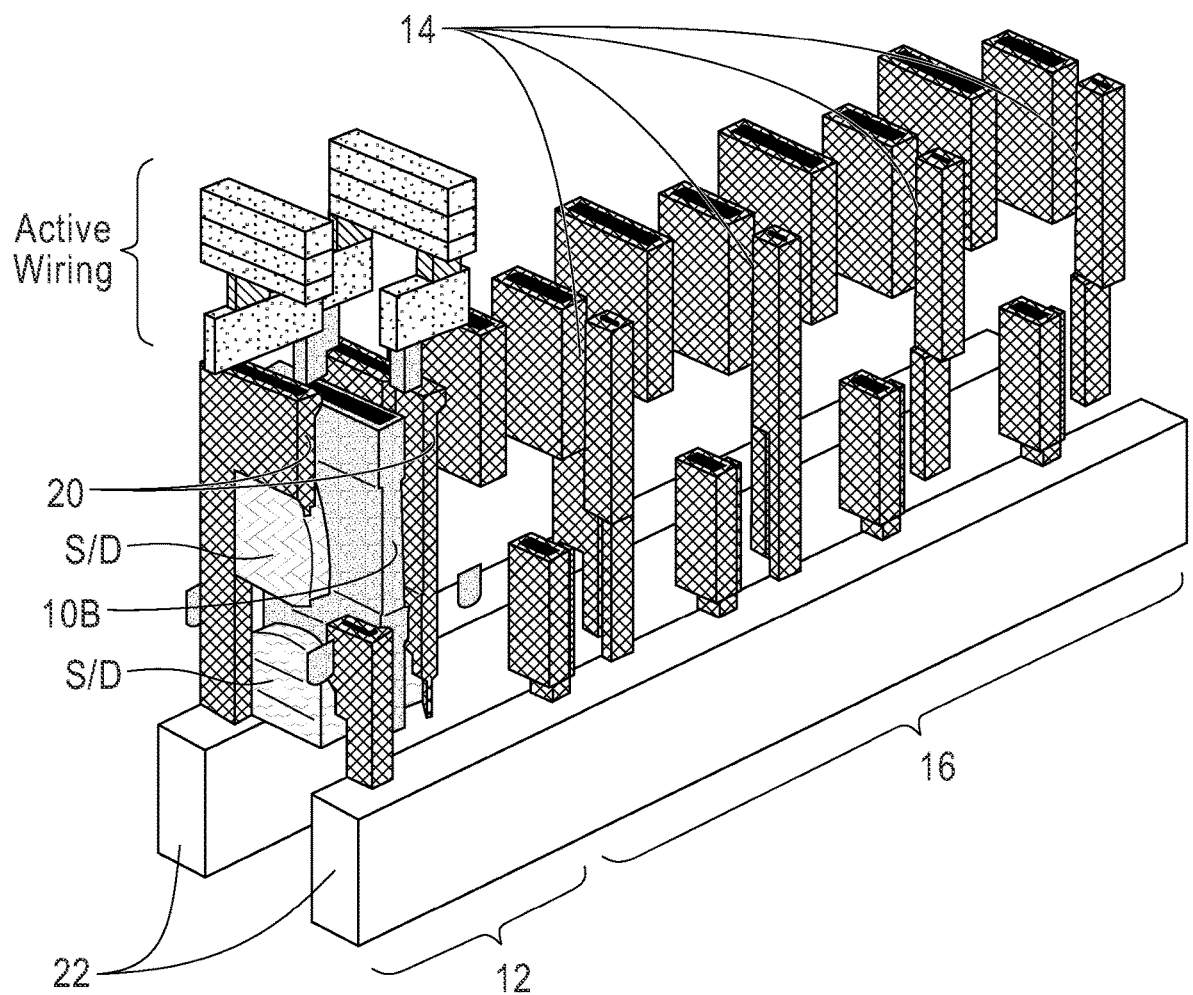
FIG. 4 is a 3D representation of a semiconductor structure in accordance with a fourth embodiment of the present application.

Reference is now made to FIGS. 1-4 which are three dimensional (3D) representations of semiconductor structures in accordance with various embodiments of the present application. Each semiconductor structure that is illustrated in FIGS. 1-4 includes vertically stacked field effect transistors 10A, 10B located in an electrically active device area 12 of the semiconductor structure. While only a single transistor 10A and a single transistor 10B is shown, it should be understood that a plurality of transistors may be included. In the illustrated embodiment of FIG. 1, dummy gates 18 are also shown in both the electrically active device area 12 and the electrically inactive device area 16. The field effect transistors include the various components mentioned above (i.e., source region, drain region, gate electrode, gate dielectric, and channel region), and can include pFETs stacked above nFETs, nFETs stacked above pFET, nFETs stacked atop nFETs, or pFETs stacked above pFETs. In FIG. 4, the source/drain (S/D) region is also shown for each of the stacked field effect transistors. The term "S/D region" denotes one of the source region or the drain region. The electrically active device area also contains vertical conductors (i.e., active device area vertical interconnect structures 20) that connect both the bottom and top field effect transistors 10A, 10B to one another and to horizontal wires above or below the transistor layers.

Each semiconductor structure that is illustrated in FIGS. 1-4 further includes an electrically inactive structure 14 located in an electrically inactive device area 16 of the semiconductor structure that is located adjacent to the electrically active device area 12 of the semiconductor structure. The electrically inactive structure 14 that is present in the electrically active device area 16 includes at least one vertical interconnect structure that continuously extends from an uppermost layer of the vertically stacked field effect transistors to a bottommost layer of the vertically stacked field effect transistors.

The electrically active device area 12 includes active wiring located above the uppermost field effect transistors (i.e., field effect transistor(s) 10B) of the vertically stack of field effect transistors. The electrically active device area 12 can include known circuitry including, but not limited to, inverters, nand gates, nor gates, and xor gates. In embodiments of the present application, a power bus can be included within the active wiring and thus can be present atop the vertically stacked field effect transistors. In other embodiments, and as is illustrated in FIG. 4, a power bus is present beneath the vertically stacked field effect transistors.

In FIG. 1, the arrows show the direction of heat flow from an uppermost tier including the uppermost field effect transistor (i.e., 10B) of the vertically stacked of field effect transistors to the semiconductor substrate (not shown) by means of the electrically inactive structures 14. The direction of the heat flow in the semiconductor structures shown in FIGS. 2-4 is the same as the heat flow illustrated in the semiconductor structure illustrated in FIG. 1.

In some embodiments (see, for example, the semiconductor structure shown in FIG. 1), the semiconductor structure further includes at least one dummy gate structure 18 located in the electrically inactive device area 16 and possibly in the electrically active device area 12 of the semiconductor structure. In some embodiments, and as is illustrated in FIGS. 2-4, no dummy gate structures are present in the electrically inactive device area 16 of the semiconductor structure. Thus, embodiments of the present application include the electrically inactive device area 16 and/or the electrically active device area 12 completely devoid of any dummy gate structures 18. In some embodiments, dummy gate structures 18 can be present in one tier (e.g., the tier including the first field effect transistors 10A), but not another tier (e.g., the tier including the second field effect transistors 10B), or in the electrically inactive device area 16 and not in the electrically active device area 12, or vice versa.

The semiconductor structure of the present application and as illustrated in FIGS. 1-4 includes at least one active device area vertical interconnect structure 20 located in the electrically active device area 12 of the semiconductor structure. The at least one active device area vertical interconnect structure 20 extends from the uppermost layer to the bottommost layer of the vertically stacked field effect transistors and contacts portions of the vertically stacked field effect transistors. The one active device area vertical interconnect structure 20 provides electrical connection within the vertically stacked field effect transistors.

In some embodiments, the at least one active device area vertical interconnect structure 20 has a substantially same shape as the at least one vertical interconnect structure that provides the electrically inactive structure 14. The shape of the at least one active device area vertical interconnect structure 20 and the at least one vertical interconnect structure that provides the electrically inactive structure 14 can include a via, a line or a combined via/line. In a combined via/line structure, the via can be located above or below the line. In the present application the vias, lines or combined vias/lines house the electrically conductive metal or metal alloy mentioned above.

In other embodiments, the at least one active device area vertical interconnect structure 20 has a different shape than the at least one vertical interconnect structure that provides the electrically inactive structure 14. In such an embodiment, and as depicted in FIG. 3, the at least one vertical interconnect structure that provides the electrically inactive structure 14 is block shaped, and the electrically inactive device area 16 is devoid of a dummy gate structure 18.

As mentioned above, and in some embodiments the semiconductor structure further includes at least one power bus located above, and electrically connected to the vertically stacked field effect transistors. In other embodiments and as shown in FIG. 4, the semiconductor structure further includes at least one power bus 22 located below, and electrically connected to the vertically stacked field effect transistors.

Although not illustrated in the drawings of the present application, the vertically stacked field effect transistors and the electrically inactive structure are embedded in an interlayer dielectric material (ILD) material. In embodiments of the present application, each field effect transistor of the vertically stacked field effect transistor is embedded in a separate ILD material. Illustrative ILD materials that can be employed include, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

Although not illustrated in the drawings of the present application, a diffusion barrier liner can be present lining sidewalls and the bottom wall of both the at least one active device area vertical interconnect structure and the vertical interconnect structure that provides the electrically inactive structure of the present application. Exemplary diffusion barrier materials that can provide the diffusion barrier liner include, but are not limited to, Ru, TiN, TaN, WN, WC, an alloy thereof, or a stack thereof such as Ti/TiN and Ti/WC.

The semiconductor structures shown in FIGS. 1-4 can be fabricated utilizing known stacked FET processing flows. Such stacked FET processing includes various deposition steps, various patterning steps, various material removal steps and various planarization steps, and may include wafer bonding steps So as not to obscure the semiconductor structure of the present application, these various processing steps are not further elaborated herein.

It is noted that FIGS. 1-4, show an electrically inactive structure 14 located in an electrically inactive device area 16 that is located adjacent to an electrically active device area 12 including vertically stacked field effect transistors 10A, 10B. As stated above, the electrically inactive structure 14 includes at least one vertical interconnect structure that continuously extends from an uppermost layer of the vertically stacked field effect transistors (i.e., 10B) to a bottommost layer of the vertically stacked field effect transistors (10A) and is configured to dissipate heat generated by the vertically stacked field effect transistors 10A, 10B into a semiconductor substrate (not shown but readily understood from the drawings illustrated in FIGS. 1-4) that is located beneath the entire structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
vertically stacked field effect transistors located in an electrically active device area of the semiconductor structure; and
an electrically inactive structure located in an electrically inactive device area of the semiconductor structure that is located adjacent to the electrically active device area of the semiconductor structure, wherein the electrically inactive structure comprises at least one vertical interconnect structure that continuously extends from an uppermost layer of the vertically stacked field effect transistors to a bottommost layer of the vertically stacked field effect transistors.

2. The semiconductor structure of claim 1, wherein the vertically stacked field effect transistors comprise a p-type field effect transistor stacked above an n-type field effect transistor.

3. The semiconductor structure of claim 1, wherein the vertically stacked field effect transistors comprise an n-type field effect transistor stacked above a p-type field effect transistor.

4. The semiconductor structure of claim 1, wherein the vertically stacked field effect transistors comprise at least two n-type field effect transistors stacked one atop the other.

5. The semiconductor structure of claim 1, wherein the vertically stacked field effect transistors comprise at least two p-type field effect transistors stacked one atop the other.

6. The semiconductor structure of claim 1, wherein the vertically stacked field effect transistors comprise three or more field effect transistors stacked one atop the other.

7. The semiconductor structure of claim 1, further comprising at least one dummy gate structure located in the electrically inactive device area of the semiconductor structure.

8. The semiconductor structure of claim 7, wherein at least a portion of the at least one dummy gate structure extends continuously from an uppermost layer of the vertically stacked field effect transistors to a bottommost layer of the vertically stacked field effect transistors.

9. The semiconductor structure of claim 1, further comprising at least one active device area vertical interconnect structure located in the electrically active device area of the semiconductor structure, and wherein the at least one active device area vertical interconnect structure extends from the uppermost layer to the bottommost layer of the vertically stacked field effect transistors and contacts portions of the vertically stacked field effect transistors.

10. The semiconductor structure of claim 9, wherein the at least one active device area vertical interconnect structure has a substantially same shape as the at least one vertical interconnect structure that provides the electrically inactive structure.

11. The semiconductor structure of claim 9, wherein the at least one active device area vertical interconnect structure has a different shape than the at least one vertical interconnect structure that provides the electrically inactive structure.

12. The semiconductor structure of claim 11, wherein the at least one vertical interconnect structure that provides the electrically inactive structure is block shaped, and the electrically inactive device area is devoid of a dummy gate structure.

13. The semiconductor structure of claim 1, further comprising at least one power bus located above, and electrically connected to, an uppermost field effect transistor of the vertically stacked field effect transistors.

14. The semiconductor structure of claim 1, further comprising at least one power bus located below, and electrically connected to, and a bottommost field effect transistor of the vertically stacked field effect transistors.

15. The semiconductor structure of claim 1, further comprising a semiconductor substrate located beneath the vertically stacked field effect transistors.

16. The semiconductor structure of claim 15, wherein the at least one vertical interconnect structure is configured to dissipate heat generated by the vertically stacked field effect transistors into the semiconductor substrate.

17. The semiconductor structure of claim 1, wherein the at least one vertical interconnect structure that provides the electrically inactive structure is composed of an electrically conductive metal or electrically conductive metal alloy.

* * * * *